US005528067A

United States Patent [19]
Farb

[11] Patent Number: 5,528,067
[45] Date of Patent: Jun. 18, 1996

[54] MAGNETIC FIELD DETECTION

[75] Inventor: Joseph E. Farb, Riverside, Calif.

[73] Assignee: Hughes Aircraft Company, Los Angeles, Calif.

[21] Appl. No.: 438,132

[22] Filed: May 8, 1995

[51] Int. Cl.$^6$ .............................. H01L 29/82; H01L 43/00
[52] U.S. Cl. .................... 257/401; 257/421; 257/426; 73/514.16; 73/DIG. 2; 324/252
[58] Field of Search ................................ 257/421, 422, 257/426, 425, 424, 401, 365, 366, 347; 73/DIG. 2, DIG. 1, DIG. 3, DIG. 4, 514.16; 324/252

[56] References Cited

U.S. PATENT DOCUMENTS 5,083,174  1/1992  Kub .......................................... 257/421

FOREIGN PATENT DOCUMENTS 4203814  10/1992  Germany .............................. 257/366
2130964   5/1990  Japan .................................... 257/421

OTHER PUBLICATIONS

Arnett et al., "Two–Drain FET Magnetic Field Sensor," *IBM Technical Disclosure Bulletin*, vol. 13, No. 12, May 1971 p. 3633.

Primary Examiner—William Mintel
Attorney, Agent, or Firm—M. E. Lachman; M. W. Sales; W. K. Denson-Low

[57] ABSTRACT

A solid state triode employs the Hall effect to asymmetrically proportion flow of current through different branches of a number of cascaded bifurcated N– charge carrier channels (10,18,20), thereby providing an indication of strength and direction of an applied magnetic field by measuring magnitude and sense of the difference between currents flowing in the two channel branches (14,16,24,26, 30,32). The solid state triode is formed on an silicon-on-insulator (SOI) substrate (47,48,49) in which an N+ source region (54) and at least two end N+ drain regions (56,58) are interconnected by an N– charge carrier channel (60) that is defined by a plurality of P+ regions (64a,64b,64c,64d) in a thin single crystal silicon substrate (49) between the source and drain regions (54,56,58). A polysilicon gate (52) overlies the N– channel and acts as a self-aligning mask during manufacture of the triode to precisely align the N+ and P+ doping to the polysilicon gate configuration. The SOI has a very thin N– doped layer to which the N+ and P+ doping is applied in steps of successively different energy levels so that the doping extends completely through the N– layer and is uniform throughout the thickness of the layer. The N– channel is narrow and has a width at least twice the thickness of the crystal silicon uppermost layer of the SOI substrate.

22 Claims, 6 Drawing Sheets

MAGNETIC FIELD DETECTION

BACKGROUND OF THE INVENTION

1. Field of the Invention

The present invention relates to magnetic field detection, and more particularly concerns solid state magnetic field sensing employing the Hall effect.

2. Description of Related Art

Magnetic sensors or magnetometers have long been used to sense motion and/or position of moving parts, such as, rotating gears or shafts. As use of computers for controlling moving machinery is more widespread, and as electronic sensing and control is more extensively used in controlling operation of moving parts, it becomes increasingly necessary to sense various conditions in the machine so as to provide required inputs to the electronic controls and computers. Automobile engines are one example of complex machines employing computer control that require sensing of various conditions to be provided to a computer that controls operation. Thus, magnetic sensors are employed to sense shaft rotation, rotation of gears, and motions of such automotive components as cam shafts, speedometers, and ignition distribution systems, for example.

A typical magnetometer includes a permanent magnet producing a permanent magnetic field that is disturbed by some part formed of magnetic material that is positioned or moves near the magnetic field. The disturbance of the magnetic field is detected by a magnetic sensor of some type to indicate position or motion of the moving part of magnetic material.

Prior magnetic sensors have employed magneto resistors and reluctance detectors. Sensitivity of such devices is poor, and it is difficult, if not impossible, for such devices to provide good signal output in the presence of low magnetic fields.

Solid state resistors have been employed in various types of sensing arrangements. In one prior sensing system a solid state resistor of relatively large dimensions is subjected to a current flow across the resistor in a first direction so that the presence of a magnetic field directed perpendicular to the plane of the resistor causes a differential voltage at opposite sides of the resistor, in a direction perpendicular to the flow of current and to the magnetic field direction. This differential voltage is a measure of magnetic field magnitude. Again, such sensors have poor sensitivity and do not provide good signals with a low magnetic field. Moreover, the resistor can provide an output indicating only the average of the magnetic field over its entire area so that the relatively large size of the resistor inherently compromises resolution.

Certain materials are known to change resistance in the presence of a magnetic field, and these too have been employed for magnetic sensing, but they are excessively expensive and difficult to manufacture.

Thus, magnetic sensors heretofore available have low sensitivity, relatively low resolution, are large and bulky, and are expensive to manufacture.

Accordingly, it is an object of the present invention to provide magnetic field detection that avoids or minimizes above-mentioned problems.

SUMMARY OF THE INVENTION

In carrying out principles of the present invention in accordance with a preferred embodiment thereof, a substrate has a source region and first and second drain regions spaced from each other and from the source region. A bifurcated charge carrier channel connects the source region with each of the drain regions so that the Hall effect caused by presence of a magnetic field that is to be detected causes flow of current to split unevenly between the branches of the bifurcated charge carrier channel. A current difference detecting circuit connected to the two drain regions provides an indication of magnitude and sense of the magnetic field by indicating magnitude and sense of the difference between the current flows in the two channel branches.

According to one embodiment of the invention a magnetic field detector is formed in the very thin single crystal silicon layer of a silicon-on-insulator (SOI) substrate by lightly doping the thin silicon layer to provide N-type silicon, and more heavily doping mutually spaced source and drain regions to provide N+ source and drain regions. A polysilicon gate having a configuration that defines the bifurcated charge carrier channel is laid down over a thin gate oxide on the thin silicon layer and extends between the source and drain regions. The polysilicon gate is employed as a self-aligning mask for implanting N-type impurities into the source and drain regions. The polysilicon gate is also employed as a self-aligning mask for implanting P-type impurities in the thin silicon layer to define the bounds of the N– charge carrier channel. According to a feature of the invention, the doping of a thin silicon layer of the SOI substrate extends completely and uniformly through the entire thickness of the very thin silicon layer.

According to another feature of the invention, the width of the N– channel is significantly greater than the thickness of the silicon substrate.

DESCRIPTION OF THE PREFERRED EMBODIMENTS

Figure 1:
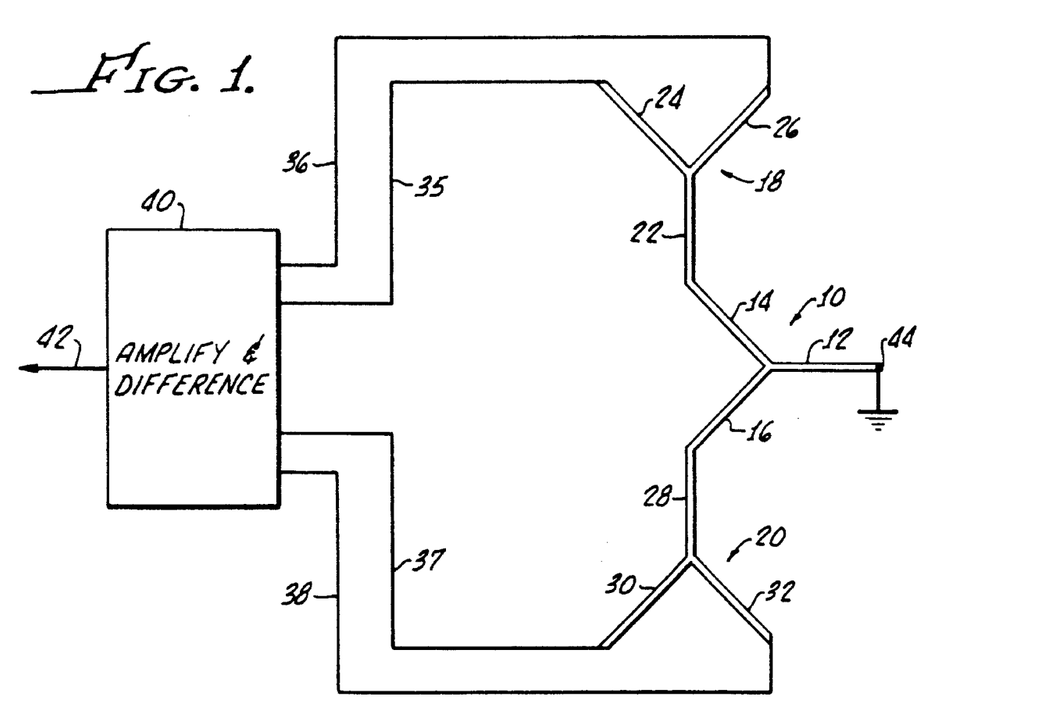
FIG. 1 is a simplified electrical schematic diagram of a two stage Hall effect magnetic field detector embodying principles of the present invention.

The simplified electrical circuit of FIG. 1 shows a two stage Hall effect magnetic field detector in one exemplary configuration and is presented to explain principles of operation of the present invention. A first electrically conductive bifurcated line, generally indicated at 10, includes a base leg 12 and first and second branch legs 14 and 16. Each of the branch legs 14 and 16 itself is connected to another bifurcated electrically conductive line 18 and 20, respectively. Bifurcated line 18 includes a base leg 22 connected to branch leg 14 of the bifurcated line 10 and further includes first and second branch legs 24,26, both connected to a common end of base leg 22 of the bifurcated line 18. Similarly, bifurcated line 20 includes a base leg 28 connected at its end to first and second branch legs 30,32 at a common junction of the base leg with the branch legs. The ends of each of the four branch legs 24,26,30,32 of this two stage device are connected by means of electrically conductive lines 35,36,37,38 to an amplifying and difference calculating circuit 40, which includes circuitry that amplifies the input signals on lines 35 through 38 and can calculate the difference between one or more pairs of its input signals. For example, the circuit 40 will amplify input signals on lines 36 and 38, which come from branch legs 26 and 32, respectively, and provide an output signal on a line 42 indicative of the difference between the signals on lines 36 and 38. Alternatively, the difference between signals in the lines of each of pairs 35,36 and 37,38 may be computed.

Branch leg 12 of the first bifurcated line 10 terminates at a contact 44, which is connected to a suitable source of potential, such as ground, for example. Power to the circuit is provided from the amplifying and difference circuit 40, and thus current will flow through the several branch circuits 10, 18 and 20.

In the presence of a magnetic field having lines of flux that extend perpendicular to the plane of the circuit 12,14,16 (assuming the legs 12, 14, and 16 all lie in a common plane, which may be the plane of the drawing) current flowing in the base leg 12 divides unevenly as it flows from base leg 12 into branch legs 14 and 16. That is, because of the Hall effect, current flowing from contact 44 toward the circuit 40 will divide between branch legs 14 and 16 in proportion to the magnitude of a magnetic field to which the bifurcated circuit line is subjected. If the magnetic flux is in a first direction, that is, going down into the plane of the paper for example, a first one of the branch legs 14 and 16 will flow a larger proportion of the current, whereas, if the magnetic field flux is in the opposite direction (coming up out of the plane of the paper), the other of the two branch legs will flow a larger proportion of the current. Current flowing in branch leg 14 flows through base leg 22, and, in the presence of the same magnetic field, also divides in proportion to the magnitude of the magnetic field, and in a sense according to direction of the magnetic field, between branch legs 24 and 26. Similarly, current flowing in branch leg 16 flows into base leg 28 and again divides proportionally in accordance with the magnitude and sense of the magnetic field between branch legs 30 and 32. The current flowing in the branch legs 24,26,30 and 32 is then received by the circuitry 40, which calculates and signals the difference, on the output line 42, between the various current flows. Differences may be taken between any pair of the current flows in lines 35 through 38, or, for example, between the lines of the pair 36,38 and again between the lines of the pair 35,37 to provide two separate readings that may be averaged.

Effectively, the bifurcated circuits are cascaded so as to multiply the division of the current that is caused by the Hall effect. For example, assume that the current ratio for the bifurcated line 10 is 1.2:1, so that the current flowing in branch leg 14 is 1.2 times the magnitude of the current flowing in branch leg 16 (in the presence of a magnetic field). The current flowing in branch leg 14 is again split in bifurcated circuit 18 between its branch legs 24 and 26 so that current splits at the same ratio and the current flowing in branch leg 26 becomes 1.2 times the current flowing in branch leg 24. Thus, the current in branch leg 26 is now $1.2^2$ or 1.44 times the current flowing in branch leg 32. Further cascading is readily possible, as by, for example, adding additional bifurcated circuits, one having a base leg connected to branch leg 26 and another having a base leg connected to branch leg 32, for example. This cascading can be carried on to cascade as many stages as desired, thereby significantly enhancing system sensitivity. The current difference between selected pairs of final branches of a multiple cascaded circuit thus gives a larger signal for a given magnitude of magnetic field.

By implementing the circuit described in FIG. 1 in a silicon-on-insulator (SOI) process, as will be described below, the magnetic sensor exhibits a significantly greater sensitivity to magnetic fields than does a prior conventional resistive type (N-type) silicon Hall effect magnetic sensors. Not only is the device illustrated in FIG. 1 more sensitive, but, as indicated, a number of stages can be cascaded together to effectively multiply the effect on a single stage, thereby significantly further increasing sensitivity.

Figure 2:
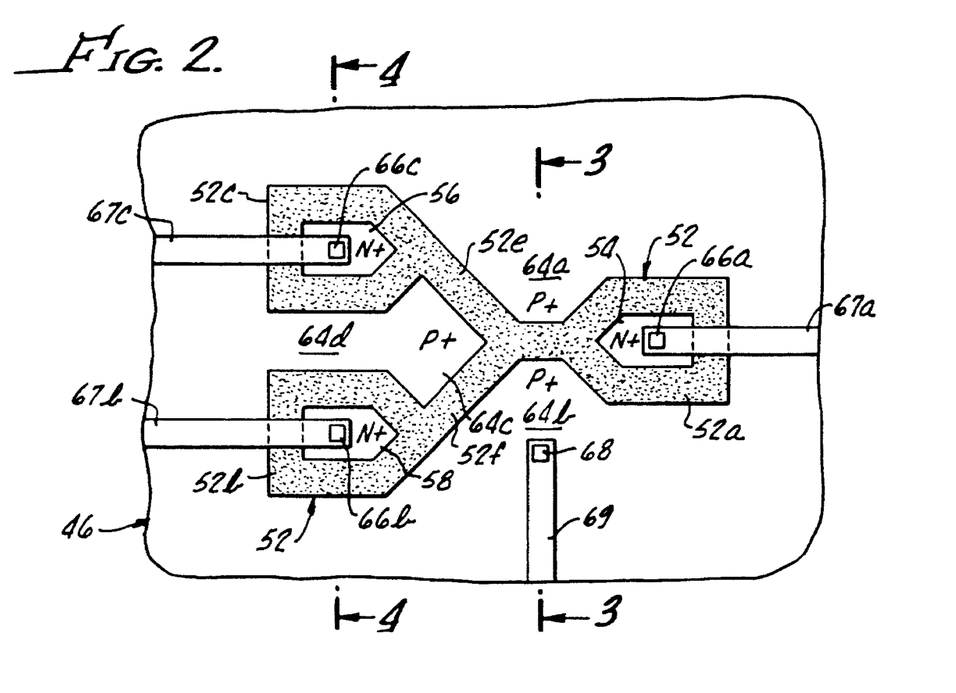
FIG. 2 is a plan view showing a single stage solid state triode magnetic field detector formed on silicon-on-insulator (SOI)
Figure 3:
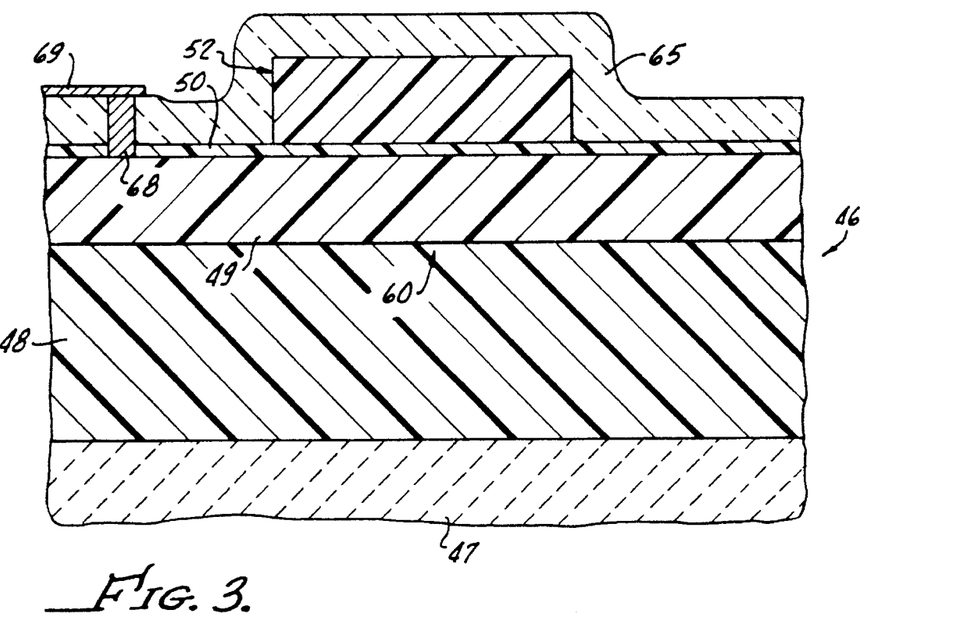
FIG. 3 is a section taken on lines 3—3 of FIG. 2.
Figure 4:
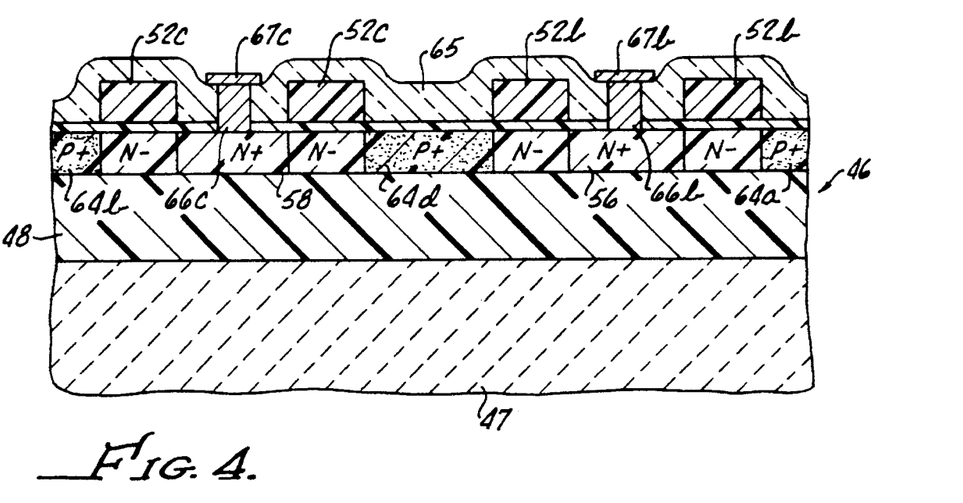
FIG. 4 is a section taken on lines 4—4 of FIG. 2.

A presently preferred SOI implementation of one stage of the circuit of FIG. 1 is shown in FIGS. 2, 3, and 4, wherein a silicon-on-insulator substrate, generally indicated at 46, includes a base silicon wafer 47, having a thickness of approximately 500 microns, bonded to a silicon dioxide layer 48, having a thickness of approximately 1 to 2 microns, and topped by a very thin single crystal silicon layer 49 having a thickness of about 0.3 to 0.5 microns or 3,000 to 5,000 angstroms. The uppermost layer 49 is covered by a thin gate oxide layer 50 of about 100 to 500 angstroms in thickness and upon which an electrically conductive polysilicon gate 52, of about 0.5 microns in thickness, is positioned. The polysilicon gate has the generally bifurcated horizontal configuration illustrated in FIG. 2, to be described in detail below. The term "horizontal" is used herein to denote directions extending parallel to the planes of the SOI substrate and its several layers, and the term "vertical" denotes a direction perpendicular to the horizontal.

The silicon layer 49 is lightly doped with phosphorus ions to provide an N– silicon which is more heavily doped with phosphorus ions at N+ source and drain regions. Layer 49 is also doped with boron ions generally over areas not covered by the polysilicon gate 52, as will be described in detail below, to provide P+ regions in a configuration mating with the configuration of the polysilicon gate 52.

As indicated in the plan view of FIG. 2, the N– silicon layer 49 is formed with a first N+ region 54 forming a source and second and third N+ regions 56,58 forming drains. The polysilicon gate has a configuration indicated by the darkened or shaded lines in FIG. 2. In the arrangement shown in FIG. 2 the polysilicon gate includes a first gate portion 52a that effectively encircles the N+ source region 54, a second gate portion 52b that encircles the first N+ drain region 56 and a third gate portion 52c that encircles the second N+ drain region 58. Between the gate portions 52a,52b, and 52c the polysilicon gate forms a narrow bifurcated gate including a narrow poly base leg 52d connecting with first and second narrow poly branch legs 52e and 52f. The poly gate portions 52a–52c and 52d–52e are all integral with each other, as illustrated.

Coextensive with and underlying the poly base and branch legs 52d,52e and 52f is a narrow N– channel 60 that is congruent with, and, as will be more particularly described below, effectively and indirectly defined by the polysilicon gate legs 52d,e, and f.

The area surrounding and completely bounding the N– channel 60 that underlies the polysilicon gate is all doped with boron ions to provide P+ regions 64a,64b,64c, and 64d. A layer of dielectric, such as an electrically non-conductive glass 65 (FIGS. 3 and 4), covers the polysilicon gate and all P+ and N+ regions. Glass 65 is omitted from FIG. 2 for clarity of illustration. Just above each of the source and drain regions there is a hole 66a,66b, and 66c formed through the glass dielectric and the gate oxide 50, which is filled with a metallized conductive material and connected to respective metal conductors 67a,67b, and 67c. The metallized holes 66a–c and metallized conductors 67a–c provide electrical contacts and leads to connect the source and drain regions, respectively, to external circuitry. Similarly, one or more holes 68 are formed through the glass dielectric and the gate oxide 50 above the P+ regions and connected to one or more metallized leads 69 that provide an electrical contact from external circuitry to all of the P+ areas, all of which are electrically connected in common. A suitable electrical connection (not shown in FIG. 2) is also provided for the polysilicon gate 52.

The above-described device forms a solid state triode that provides a Hall effect magnetometer. It is readily manufactured by conventional processes employed for manufacture of N– channel, CMOS devices. Standard CMOS procedures are modified to provide for self-alignment of N+ and P+ doping regions (as described in detail below), and also to ensure uniformity of the doping through the complete thickness of the thin single crystal silicon layer 49. Manufacturing starts with provision of a silicon-on-insulator substrate, such as the SOI material available from Hughes Danbury Optical Systems. As previously described, such SOI substrate includes a silicon base 47 (see FIG. 5), a thinner oxide layer 48 and a very thin single crystal silicon layer 49. As previously mentioned, the single crystal silicon layer has a thickness in the order of about 0.3 to 0.5 microns, or about 3,000 to 5,000 angstroms.

As a first step, the layer 49 is subjected to several phosphorus ion (N-type) implants or doping of different energies to accomplish a doping of the SOI layer 49 uniformly from its top to its bottom over its entire thickness. In a particular example, for a silicon layer of 3,000 angstroms, this N-type doping of layer 49 takes place in three steps at implant energies of 32.1 KEV, 86 KEV, and 186 KEV, respectively. The order of these doping steps may be reversed if desired. If deemed necessary or desirable, a diffusion step at this point (after all N-doping steps) will help to make the doping more uniform. Such diffusion step includes the heating of the substrate. It will be understood that the higher implant energies should be used for silicon layers of thicknesses greater than 3,000 angstroms, and for greater thicknesses one or more additional implants steps will be used to avoid too great a difference between energy levels of successive steps.

Figure 5:
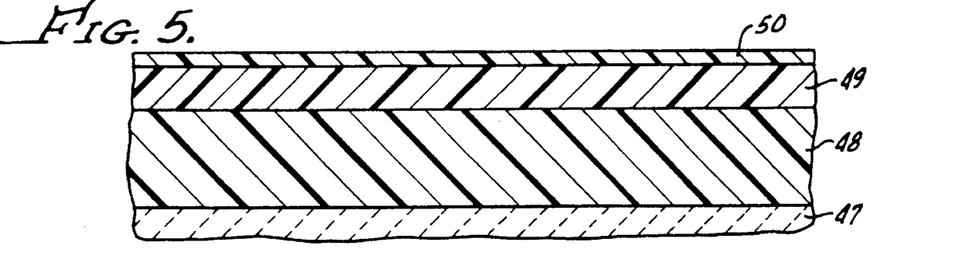
FIGS. 5, 6, 7 and 8 illustrate certain steps in the manufacture of a the solid state triode magnetic field detector of FIGS. 2 through 4.

Next, the thin gate oxide layer 50 is grown on the silicon layer 49, as shown in FIG. 5.

Figure 6:
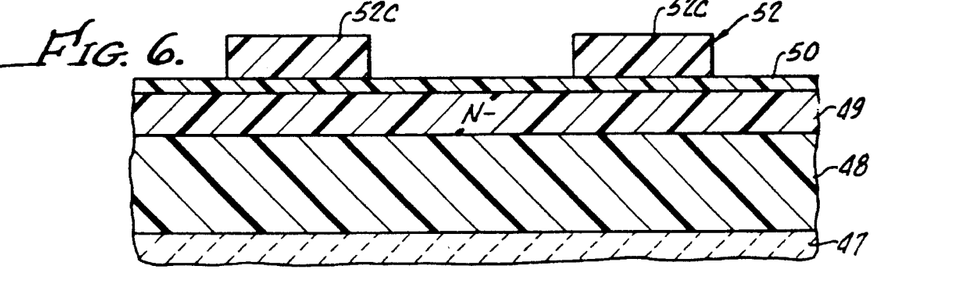

The next step is to cover the gate oxide surface 50 with a layer of polysilicon, which is then masked and etched to delineate the regions that will be doped with boron ions to form the P+ regions, and with phosphorus ions to form the N+ source and drain regions. The P+ regions will define self-aligned channel regions of depleted space charge. The polysilicon layer, after masking and etching, has the horizontal configuration such as shown for the polysilicon 52a–f of FIG. 2, having a generally bifurcated central section with a base leg 52d and branch legs 52e and 52f connecting respectively with the poly sections 52a,52b and 52c that circumscribe source and drain regions 54,56,58. A section of the assembly constructed to this point appears as illustrated in FIG. 6.

Figure 7:
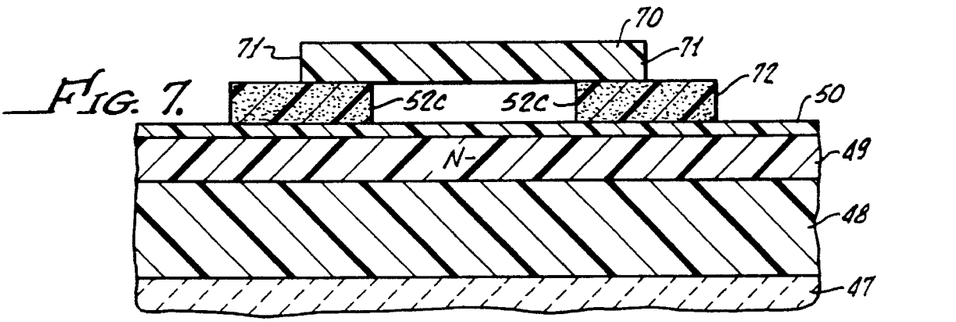
Figure 8:
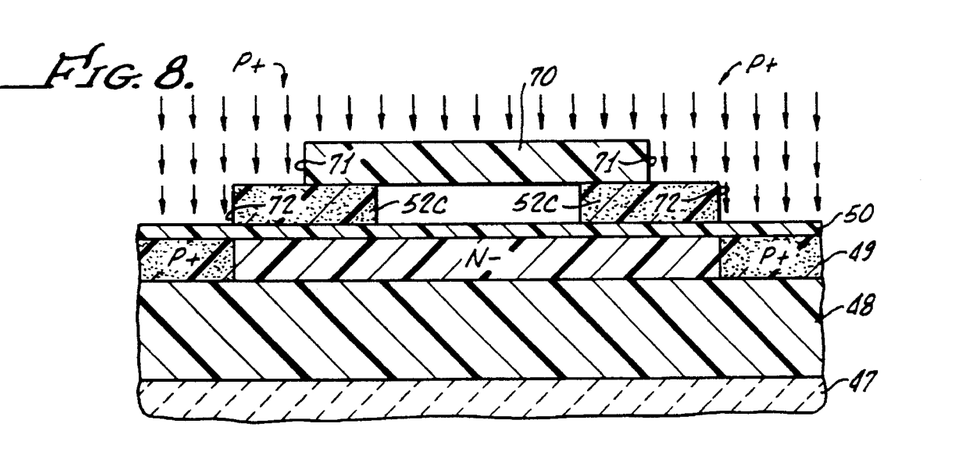
Figure 9:
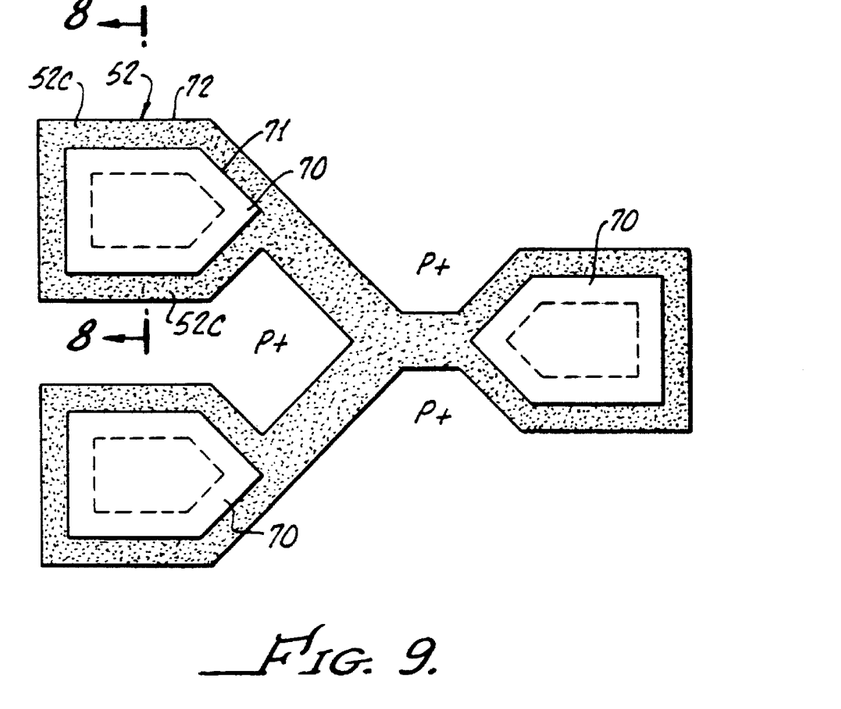
FIG. 9 illustrates orientation, configuration and positioning of a mask for doping P+ regions.

Now a mask is applied to the device, having a configuration as illustrated by mask sections 70a,70b,70c of FIGS. 7–9. FIGS. 7 and 8 show sections through one of the drain regions (region 56), but before the N+ implantation. The mask sections are provided for covering and masking the N+ source and drain areas 54,56,58 during the P+ implantation. Each mask section, as can be seen in FIGS. 7,8, and 9 has substantially the same configuration as the source and drain region holes, but is larger, having its outer edges 71 positioned inwardly (at about one-half gate width) of the outer edges 72 of the polysilicon gate section 52c. With this arrangement the high energy boron implant is self-aligned by the edges 72 of the gate, with the mask sections merely blocking the openings in the ends of the polysilicon gate that circumscribe the source and drain regions. These source and drain regions are to be subjected to a phosphorus N+ implantation in a subsequent step. FIGS. 7–9 show the relation of the mask sections 70a,70b,70c to the polysilicon gate section 52c, showing the mask edges 71 stepped back inwardly from the outer edges 72 of the poly gate. The mask can be precisely configured, but equal precision in positioning several masks to obtain precision in relative positioning is very difficult, if not nearly impossible. Therefore, by using the polysilicon gate to align the P+ (and N+) doping regions, the problems of mask alignment are effectively avoided.

Operation of the polysilicon gate as a self-aligning mask is illustrated in FIG. 8, which shows the arrangement of FIG. 7 subjected to boron ion implantation that is depicted in FIG. 8 by the arrows designated as P+. The P+ ions pass through the very thin gate oxide coating 50 and into the crystal silicon layer 49 in areas that are precisely delineated, not by the mask 70, but rather by the edges 72 of the polysilicon 52. At the narrow gate leg sections 52e and 52f, etc. (see FIG. 2) no mask is needed during P+ ion implantation. Thus, the polysilicon 52 indirectly defines the position and configuration of the very narrow N– channel because the polysilicon directly defines the areas reached by the P+ implant ions, and the position and configuration of the P+ area in turn directly delineate the N– channel 60 that forms the electron conductor of the Hall effect sensor. The N– depletion channel 60 is directly bounded and defined by P+ regions on either side of the channel.

The doping of the single crystal silicon layer must be uniform from top to bottom in order to obtain uniform N– channel width from top to bottom of the silicon layer 49. For this reason the layer 49 is made with a very small thickness (the 0.3 or 0.5 micron thickness is the presently preferred thickness), and the P+ implantation is performed in several steps with different energies. For example, for the boron ion implant in a 0.3 micron layer, four implant steps are employed in sequence, the first at an energy level of 6.85 KEV, a second at 19.48 KEV, a third at 43.27 KEV, and the last at 80.25 KEV. This sequence may be reversed, with 80.25 KEV first, if desired. Again, greater implant energies or even more implant steps may be used for layers of a thickness greater than 0.3 microns. To smooth variations in the vertical profile of implant ion density from top to bottom of the 0.3 micron single crystal silicon layer, the implants may be diffused slightly in a heating step (following completion of the four ion implant steps) by heating the device for about one hour at approximately 850° C., for example.

Having performed the P+ implants, the N+ implants for the source and drain regions 54,56,58 are now accomplished.

Figure 10:
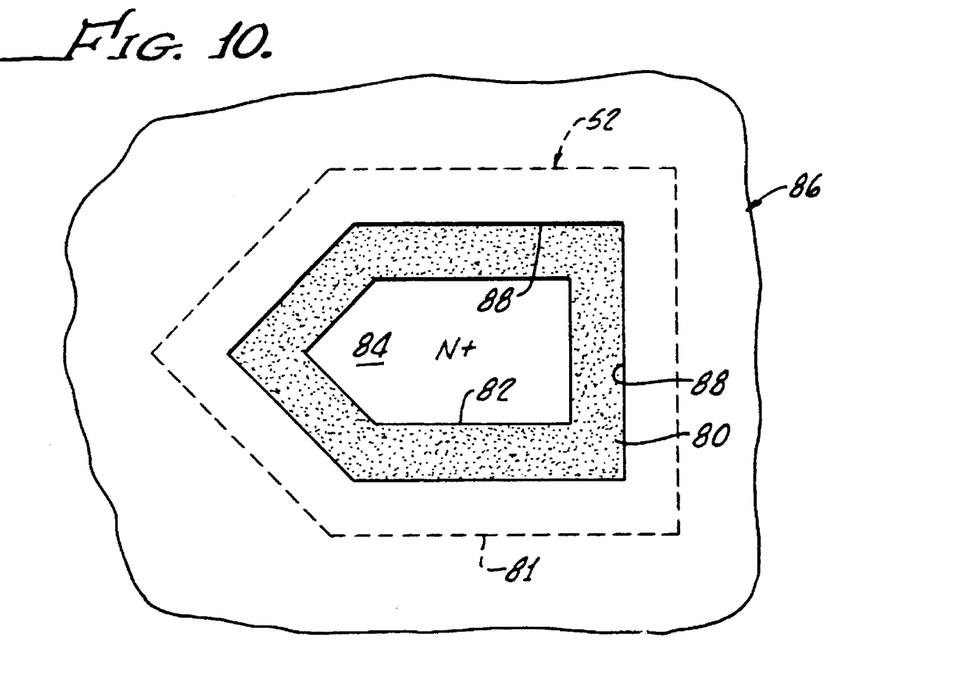
FIG. 10 illustrates orientation and configuration and positioning of a mask for doping N+ regions.

A similar procedure is followed to form the N+ implants. Again, a mask slightly smaller than the polysilicon gate is employed. For N+ implanting of the N+ source and drain regions, the implanting is performed through the holes originally formed in the polysilicon gate, which holes conform to and directly delineate the desired area of the source and drain regions. The holes in the gate 52 are defined by gate inner edges 82 (FIG. 10). For example, as shown in FIG. 10, a portion 80 of the polysilicon gate, having an outer edge 81. An inner edge 82 of this gate portion 80 delineates a hole that defines the area 84 of the N+ region that is now to be implanted. A mask 86 is employed, having a hole 88 that is stepped back (about one-half the gate width) from the inner edge 82 of the hole in the poly gate so that it is the poly itself that aligns the N+ implant at this time. Mask 86 is employed to block the N+ implant from all portions of the device other than the source and drain regions 54,56,58 and, therefore, covers other parts of the polysilicon gate and all of the P+ regions. Because the N+ implants form contact regions, uniformity of implantation density is not needed at these areas. In an exemplary process the N+ implantation is done by a single step of implanting phosphorus ions with an energy of about 50 KEV.

After completion of all implants, the entire device, polysilicon gate N+ source and drain regions, and P+ regions are covered with a flow glass 65 (FIGS. 3 and 4) which is a dielectric material that is heated to flow over and cover the entire surface. Thereafter the several contact holes are etched through the flow glass and gate oxide layer 50 above the source and drain regions and at one or more areas of the P+ regions. These contact holes are filled with metal and connected to metal conductive lines, which are formed by conventional procedures. Conductive lines are also connected to the polysilicon gate through holes (not shown) formed in the flow glass.

It will be understood that the sensor described above is utilized with other circuitry, such as indicated in FIG. 1, including amplifying, difference calculation .and processing circuitry or the like, and that such other circuitry may also be formed together with the described CMOS process simultaneously with the described forming of the magnetic field detection portion of the apparatus.

According to a significant feature of the invention, the P+ regions are uniquely positioned and configured to define a narrow N− channel that is a depleted space charge region having charge carriers of exceedingly high mobility. An N− channel width of 2 microns is presently preferred. A width greater than about 5 to 10 microns or less than about 0.5 microns makes the device very difficult to control. Thus, a very narrow high mobility N− channel is defined and bounded by the P+ areas, with this channel having a precise and exceedingly uniform cross sectional area throughout its length. The width of the channel is precisely uniformly defined from top to bottom of the silicon layer 49 by the uniformity of the P+ doping, and the uniformity of the depth or thickness of the channel from top to bottom of the silicon layer 49 is defined by the uniformity of the thickness of this layer itself. Preferably the channel width is not less than two times the thickness of the silicon layer 49, in order to allow for possible P-type side diffusion.

The single stage device shown in FIGS. 2, 3 and 42 has a single N+ source 54 and two N+ drains 56 and 58. The P+ regions effectively provide the gate of the device, and voltage applied to the polysilicon gate is maintained to keep the surface accumulation or inversion constant for optimal operation. Source 54 is grounded, a negative voltage of up to 10 volts is applied to the P+ areas, to thereby strongly pinch off the N− channel defined between the P+ areas, and a positive voltage of up to 10 volts is applied to the drains 56 and 58 to draw electrons from the source through the depleted space charge region of the N− channel. Electron transport through this depleted space charge region is similar to that of a solid state triode and exhibits exceedingly high carrier mobility, which in turn enhances sensitivity by resulting in a greater difference in current split in the presence of a magnetic field.

As previously described, if a magnetic force is applied with lines of flux extending normal to the plane of the device in either direction (e.g., into or out of the plane of the paper), the electrons in the N− channel (at the potential minimum from the P+ regions on either side) experience a force that causes more of such electrons to flow into one of the branches of the bifurcated channel than the other. By measuring the electrical current difference in the two drains, magnetic field intensity is measured. This current difference is linearly proportional to magnitude of magnetic field strength. The very high mobilities of electrons in the N− channel depletion region exhibit great sensitivity to magnetic fields. Further, because of the very narrow size, width and length of the device, its resolution is high, since the device experiences only a small area of a applied magnetic field, namely in the area of its bifurcated end channel. Further, as mentioned above, several stages can be cascaded together to multiply the effect of the current split in each stage.

Figure 11:
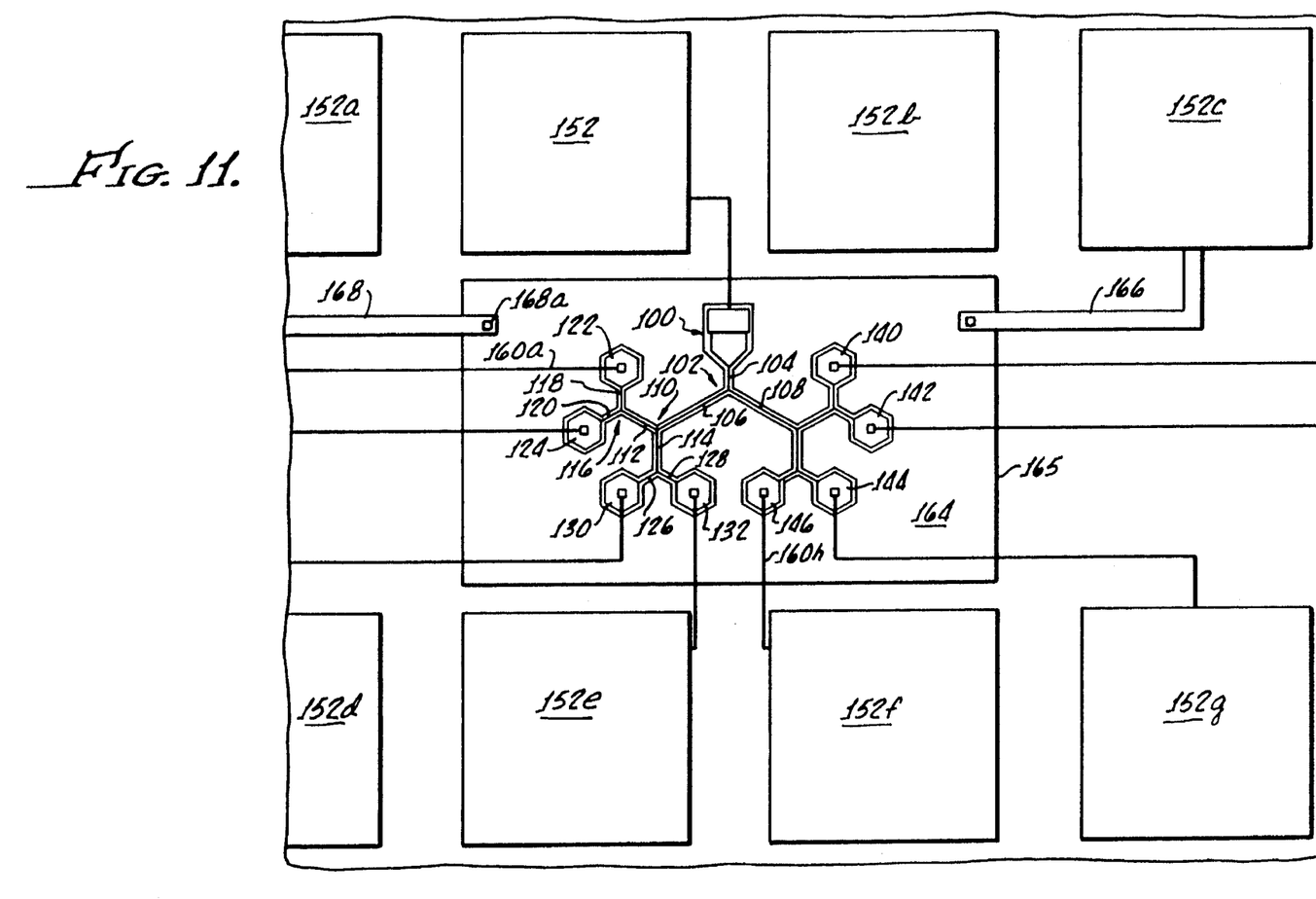
FIG. 11 illustrates the geometry of an exemplary three stage embodiment of the solid state Hall effect magnetic field detector.

FIG. 11 illustrates an alternative embodiment in which the geometry of the bifurcated channels is changed to form a three stage arrangement with connections to contact pads external to the sensor but formed on the same substrate. FIG. 11 shows only the horizontal geometry of the bifurcated channels, with all-layers above the channel bearing layer 49 removed.

A first bifurcated channel 102, having a base leg 104 and first and second branch legs 106,108, extends from a source region 100. Branch leg 106 forms a base leg of a second bifurcated channel 110, having branch legs 112 and 114. Part of a third stage is formed by a bifurcated channel 116 having branch legs 118 and 120 which terminate in N+ drain regions 122 and 124, respectively. Similarly, base leg 114 of bifurcated channel 110 has branch legs 126,128 which terminate in N+ drain regions 130,132. The branch leg 108 of the first bifurcated channel 102 similarly branches first and second times to provide second and third stages, having branch legs finally terminating in N+ drain regions 140,142,144,146. The arrangement is symmetrical about the base leg 104, with the two halves, starting with branch leg 106 on the one side and branch leg 108 on the other side, being identical to one another.

A contact lead 150 connects source region 100 to a pad 152 formed in the silicon layer 49 as one of an array pads 152a,152b,152c,152d, 152e,152f, and 152g, among others (not shown). Lead 150 is connected to the source region through a metal filled hole 151 in the gate oxide that overlies the source region. Similarly, each of the drain regions is connected to its lead through a metal filled hole extending through the gate oxide between the lead and the N+ drain regions. Each of the drain regions 122,124,130,132,140,142, 144,146 are connected by leads indicated at 160a–160h to different ones of the pads 152a–152g, excepting in this illustration pad 152c. The latter is connected by a poly lead 166 to the P+ area 164 that is delineated in the drawing by the rectangular line 165. All of the area within the rectangle 165 of FIG. 11 is P+, except, of course, for those areas containing the N− channel and the N+ source and drain regions. The P+ area is connected by one or more leads 166, which may include a second lead 168, also connected to the P+ area by means including a metal filled hole 168a extending from the lead 168 through the gate oxide layer 50 to the P+ silicon region in the silicon layer. Similarly, lead 166 connects to the silicon layer through the gate oxide by means of a metal filled hole 166a extending through the gate oxide. Each of the pads 152a–152g may have a dimension in the order of 4 mils on a side, which, of course, is significantly greater than the total area of the source and drain regions, but is in the order of about one-half or slightly less than the total area of the entire P+ region 165. The polysilicon gate is not shown in FIG. 11, but, as in FIGS. 2–4, extends along and above the illustrated bifurcated channels.

In the three stage arrangement of FIG. 11, the final difference in the current split between the two symmetrical halves of the cascaded stages is effectively the cube of the current split in one channel, presuming that the bifurcations of the N– channels are all symmetrical. Thus, for example, if the current ratio for a single split is 1.2:1, the ratio for a three stage sensor or three cascaded splits is $1.2^3:1$ or 1.728:1. Of course, additional stages beyond three cascaded stages may be used if deemed necessary or desirable.

Figure 12:
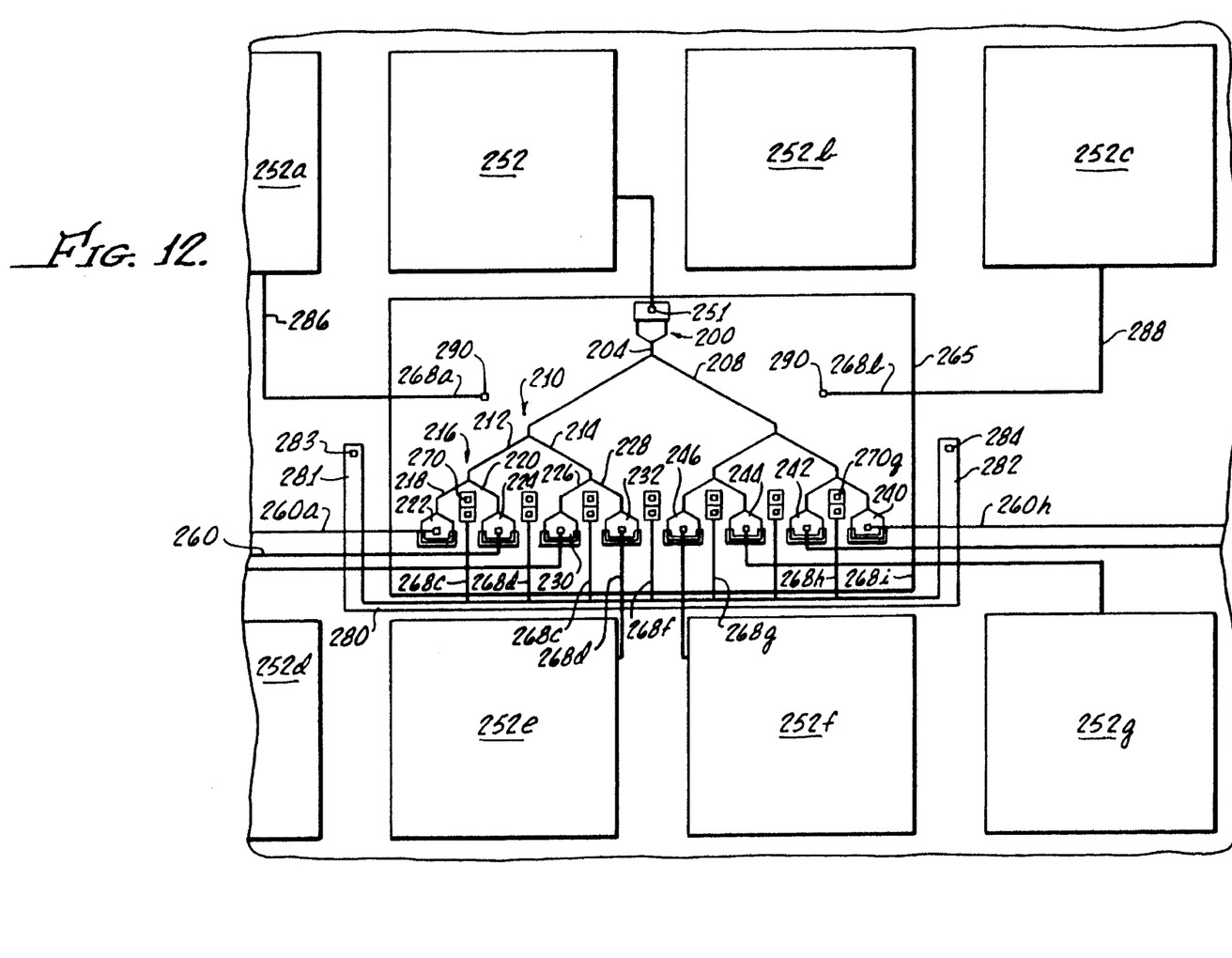
FIG. 12 illustrates a different geometric configuration.

FIG. 12 illustrates another arrangement of a three stage triple cascaded bifurcated N– solid state triode channel which operates precisely the same as the arrangement of FIG. 11 but differs only in employing a different horizontal geometry of the layout of the three cascaded bifurcated channels. Again, the arrangement of FIG. 12, like that of FIG. 11, shows only the horizontal layout of the P+, N– and N+ regions with their electrical connections, but does not show the overlying poly gate or its electrical connections. An N+ source region 200 is connected to a first bifurcated channel 202, including a base leg 204 and branch legs 206,208. Branch leg 206 forms the base leg of a second bifurcated channel 210 having branch legs 212,214. Leg 212 forms the base leg of a third bifurcated channel 216 having branch legs 218,220, each of which has its end connected to an N+ drain region 222,224. Branch leg 214 similarly forms the base of a bifurcated channel having branch legs 226,228 which terminate in N+ drain regions 230,232. Again the three cascaded stages are symmetrical about the right and left side, as viewed in FIG. 12, so that branch leg 208 forms the base leg of an additional bifurcated channel having branch legs which in turn form base legs of third stage bifurcated channels. The third stage branch legs terminate in N+ drain regions 240,242,244,246.

Source 200 is connected via a hole 251 extending through the gate oxide to a metal lead 250 that connects to a pad 252, formed as one of a plurality of connecting pads 252a–252g and others (not shown) formed in the single crystal silicon layer 49. In a like manner, each of the drain regions 222,224,230,232,240,242,244,246 are connected by leads 260a–260h, respectively, and suitable metal filled apertures through the gate oxide, to different ones of the connecting pads, only some of which are shown in FIG. 12. In the arrangement of FIG. 12 a plurality of conductive leads 268a–268i are connected to contacts 270a–270g, which are connected through metal filled apertures in the gate oxide to different areas of the P+ region, it being understood that all of the area of the sensor within the rectangle 265 is doped with P+ ions, excepting only those areas of the source and drain regions and the N– channels. The P+ regions in and around the drain and source regions and the N– channels are as previously described, self-aligned and delineated by the polysilicon gate (not shown in FIGS. 11 and 12). P+ connecting leads 268c–268i are all connected to a common P+ connecting bus 280, having legs 281 and 282 which connect at points 283,284 to two leads 286,288 that connect to pads 252a and 252c. Leads 268a and 268b extend to points 290,291 in the P+ region for direct connection to the P+ region through the gate oxide. The arrangement of FIG. 12 provides for a large number of connections to the P+ region, with all of the P+ region connections being connected to one another so as to provide a single common potential to the P+ region throughout its area.

The outside edge 165,265 in FIGS. 11 and 12 may be defined by a silicon island etch.

Although the devices described above may be made in complementary type materials, with the thin single crystal silicon layer being doped P–, the source and drain regions being P+, and the regions defining the bifurcated channel or channels being N+ materials, the configuration described and shown in the drawings is preferred because of the higher sensitivity of N– channels to the Hall effect. Utilization of N– channels provides greater sensitivity than does a comparable P– channel because the carriers in the N– channel respond more actively to the presence of a magnetic field.

There have been described several examples of a large, nearly unlimited number of different geometrical layout variations, not as a limitation on the number of configurations available, but merely to suggest the extent and variety of the layout limitations which may be employed. Other variations may include use of two or more parallel N+ source regions instead of the single source region of the illustrated embodiments. In such an arrangement a single metal conductor would connect the several N+ source regions to one another, and, of course, a similar single conductor would connect all the P+ regions. In the described multiple stage system, a magnetic field may be measured by measuring the voltage between each adjacent pair of N+ drains to provide an average voltage difference, or a single voltage difference between the two most extreme N+ drains may be employed to measure magnetic field intensity.

There have been described methods and apparatus for providing magnetic field detection in a manner that generates strong signals at very low magnetic fields, and in an arrangement that does not require exotic materials but uses conventional CMOS or equivalent manufacturing techniques that allow the fabrication of very low power electronic circuitry readily integrated with the sensor on the same chip. The device, accordingly, is less expensive and more readily reproducible.

What is claimed is:

1. A semi-conductor device comprising:

a substrate comprising a single crystal silicon layer of N– type and having a thickness of 0.3 to 0.5 microns;

a first region of N+ type on said substrate;

second and third regions of said N+ type on said substrate and spaced from each other and from said first region;

a fourth region of P+ type on said substrate interposed between said first region and said second and third regions and defining a bifurcated channel of said N+ type extending from said first region to each of said second and third regions; and conductive elements connected to said regions.

2. The semi-conductor device of claim 1 wherein said fourth region comprises a plurality of mutually discrete channel defining regions spaced from one another and defining said bifurcated channel, said bifurcated channel comprising a depleted space charge channel extending between said first region and said second and third regions.

3. The semi-conductor device of claim 1 including an elongated conductive gate overlying and indirectly delineating said bifurcated channel.

4. The semi-conductor device of claim 3 wherein said fourth region extends along and delineates said bifurcated channel, and wherein said elongated conductive gate has a configuration delineating said regions and thereby indirectly delineating said bifurcated channel.

5. The semi-conductor device of claim 1 wherein said substrate comprises a body of silicon-on-insulator (SOI) having said single crystal silicon layer, said fourth region being formed in said single crystal silicon layer and being substantially uniformly doped throughout the thickness of said single crystal silicon layer.

6. The semi-conductor device of claim 1 further comprising a gate oxide overlying said single crystal silicon layer, and an electrically conductive gate on said gate oxide layer overlying said bifurcated channel.

7. The semi-conductor device of claim 6 wherein said electrically conductive gate is bifurcated and generally configured the same as said bifurcated channel, said electrically conductive gate having enlarged end portions overlying said first, second and third regions and having openings in said enlarged end portions that are substantially coextensive with said first, second and third regions, respectively.

8. The semi-conductor device of claim 6 wherein said N− layer is uniformly doped throughout the thickness of said single crystal silicon layer, and wherein said fourth region is uniformly doped throughout the thickness of said single crystal silicon layer, said fourth region having mutually spaced adjacent sections defining an N− depleted space charge channel between said sections extending from said first region to said second and third regions and underlying said electrically conductive gate.

9. The semi-conductor device of claim 8 wherein said single crystal silicon layer has a thickness of about 0.3 microns, and wherein said depleted space charge channel has a uniform width of about 2 microns.

10. A solid state magnetic field detector comprising;

a substrate having a source region, and first and second drain regions spaced from each other and from said source region, wherein said substrate comprises a silicon-on-insulator body having a silicon layer with a thickness of 0.3 to 0.5 microns and being doped with a first type of impurity at a first doping level, and said source and drain regions comprise areas of said silicon layer doped with said first type of impurity at a second doping level which is higher than said first doping level; and a bifurcated charge carrier channel connecting said source region with each of said drain regions wherein said silicon layer is doped with a second type of impurity along and on opposite sides of said channel.

11. The solid state magnetic field detector of claim 10 including a gate overlying and coextensive with said channel, and electric potential conductors connected to said gate and to said source and drain regions.

12. The solid state magnetic field detector of claim 10 including a current difference detecting circuit connected to said drain regions.

13. The solid state magnetic field detector of claim 10, wherein said substrate is of a first type and includes a plurality of regions of a second type delineating said channel.

14. The solid state magnetic field detector of claim 10 wherein said silicon layer is doped with said second type of impurity uniformly from top to bottom of said silicon layer.

15. The solid state magnetic field detector of claim 10 wherein said channel has a uniform width.

16. The solid state magnetic field detector of claim 10 wherein said channel extends completely through said lightly doped silicon layer.

17. The solid state magnetic field detector of claim 16 wherein said channel has a width not less than about twice the thickness of said silicon layer which is doped at said first doping level.

18. The solid state magnetic field detector of claim 17 wherein said channel has a width not greater than about 10 microns.

19. The solid state magnetic field detector of claim 10 wherein said substrate includes a layer of N− material, said source and drain regions comprising N+ regions, and including a plurality of P+ regions in said silicon layer interposed between said N+ regions and configured to define said channel as an N− channel between said P+ regions.

20. The solid state magnetic field detector of claim 19 wherein said layer of N− material and said P+ regions are uniformly doped for the entire thickness of said silicon layer.

21. The solid state magnetic field detector of claim 20 including a conductive gate overlying said channel, and contacts on said regions and said gate for applying electrical potential.

22. The solid state magnetic field detector of claim 10 wherein said bifurcated charge carrier channel has a base leg connected at a common junction to first and second branch legs, and including second and third bifurcated charge carrier channels connected respectively with said first and second branch legs, said first drain region and a third drain region being connected to said second bifurcated channel and said second drain region and a fourth drain region being connected to said third bifurcated channel.

* * * * *